(12) United States Patent
Reinhardt et al.

(10) Patent No.: US 11,705,880 B2
(45) Date of Patent: Jul. 18, 2023

(54) PROCESS FOR PRODUCING A MICRO-ELECTRO-MECHANICAL SYSTEM FROM A TRANSFERRED PIEZOELECTRIC OR FERROELECTRIC LAYER

(71) Applicants: COMMISSARIAT A L'ENERGIE ATOMIQUE ET AUX ENERGIES ALTERNATIVES, Paris (FR); UNIVERSITE DE FRANCHE-COMTE, Besancon (FR); ECOLE NATIONALE SUPERIEURE DE MECANIQUE ET DES MICROTECHNIQUES, Besancon (FR)

(72) Inventors: Alexandre Reinhardt, Grenoble (FR); Marie Bousquet, Grenoble (FR); Ausrine Bartasyte, Le Duc (FR)

(73) Assignees: COMMISSARIAT A L'ENERGIE ATOMIQUE ET AUX ENERGIES ALTERNATIVES, Paris (FR); UNIVERSITE DE FRANCHE-COMTE, Besançon (FR); ECOLE NATIONALE SUPERIEURE DE MECANIQUE ET DES MICROTECHNIQUES, Besançon (FR)

( * ) Notice: Subject to any disclaimer, the term of this patent is extended or adjusted under 35 U.S.C. 154(b) by 528 days.

(21) Appl. No.: 16/801,051

(22) Filed: Feb. 25, 2020

(65) Prior Publication Data
US 2020/0287511 A1 Sep. 10, 2020

(30) Foreign Application Priority Data
Mar. 5, 2019 (FR) ...................... 1902226

(51) Int. Cl.
*H03H 3/02* (2006.01)
*H03H 9/02* (2006.01)
(Continued)

(52) U.S. Cl.
CPC .......... *H03H 3/02* (2013.01); *H03H 9/02031* (2013.01); *H03H 9/02228* (2013.01);
(Continued)

(58) Field of Classification Search
CPC .. H03H 3/02; H03H 9/02031; H03H 9/02228; H03H 9/173; H03H 9/175;
(Continued)

(56) References Cited

U.S. PATENT DOCUMENTS

2010/0029031 A1* 2/2010 Perruchot ........... B81C 1/00507
257/E21.085
2013/0249648 A1 9/2013 Reinhardt et al.
2017/0077386 A1 3/2017 Shealy

FOREIGN PATENT DOCUMENTS

EP 2 464 006 A1 6/2012
EP 3 591 724 A1 1/2020
(Continued)

OTHER PUBLICATIONS

Lin et al., "Epitaxial growth of Pb(Zr,Ti)O3 on Si and its nanoscale piezoelectric properties", Applied Physics Letters 80, 97 (2002); https://doi.org/10.1063/1.1428413. (Year: 2002).*
(Continued)

*Primary Examiner* — Hafizur Rahman
(74) *Attorney, Agent, or Firm* — BakerHostetler

(57) ABSTRACT

A process for fabricating a micro-electro-mechanical system, includes the following steps: production of a stack on the surface of a temporary substrate so as to produce a first assembly, comprising: at least depositing a piezoelectric material or a ferroelectric material to produce a layer of
(Continued)

piezoelectric material or of ferroelectric material; producing a first bonding layer; production of a second assembly comprising at least producing a second bonding layer on the surface of a host substrate; production of at least one acoustic isolation structure in at least one of the two assemblies; production of at least one electrode level containing one or more electrodes in at least one of the two assemblies; bonding the two assemblies via the two bonding layers, before or after the production of the at least one electrode level in at least one of the two assemblies; removing the temporary substrate.

18 Claims, 16 Drawing Sheets

(51) Int. Cl.
H03H 9/17 (2006.01)
H10N 30/072 (2023.01)
(52) U.S. Cl.
CPC ............ *H03H 9/173* (2013.01); *H03H 9/175* (2013.01); *H03H 9/176* (2013.01); *H10N 30/072* (2023.02); *H03H 2003/021* (2013.01); *H03H 2003/025* (2013.01)
(58) Field of Classification Search
CPC ............. H03H 9/176; H03H 2003/021; H03H 2003/025; H01L 41/312

USPC ........................................................ 29/25.35
See application file for complete search history.

(56) References Cited

FOREIGN PATENT DOCUMENTS

WO 2011/042388 A1 4/2011
WO 2019/129979 A1 7/2019

OTHER PUBLICATIONS

Curie, et al., Notice sur les travaux scientifiques de M.P. Curie, Gauthier-Villars (1902).
Kadota, et al., "FBAR using LiNbO3 thin film deposited by CVD", IEEE International Ultrasonics Symposium, 2010.
Kadota, et al., "High-Frequency Lamb Wave Device Composed of MEMS Structure Using LiNbO3 Thin Film and Air Gap", Transactions on Ultrasonics, Ferroelectrics and Frequency Control, vol. 57, No. 11, pp. 2564-2571, 2010.
Bousquet, et al., "Pt-less silicon integration of PZT sol-gel thin films for microelectronics", Electroceramics XIV, 2014.
Reinhardt, et al., "Acoustic filters based on thin single crystal LiNbO3 films: Status and prospects", 2014 IEEE International Ultrasonics Symposium, pp. 773-781, Sep. 3, 2014.

* cited by examiner

PROCESS FOR PRODUCING A MICRO-ELECTRO-MECHANICAL SYSTEM FROM A TRANSFERRED PIEZOELECTRIC OR FERROELECTRIC LAYER

CROSS-REFERENCE TO RELATED APPLICATIONS

This application claims priority to foreign French patent application No. FR 1902226, filed on Mar. 5, 2019, the disclosure of which is incorporated by reference in its entirety.

FIELD OF THE INVENTION

The field of the invention is that of piezoelectric micro-electro-mechanical systems (MEMS) used as information processing elements (resonators, filters, etc.), as sensors (physical sensors of temperature, pressure, acceleration, magnetic field, chemical species, etc.) or as actuators (micro-pumps for micro-fluidic systems, deformable micro-mirrors, etc.).

BACKGROUND

Electromechanical components form an independent class of components that are used in various systems. These elements for example allow mechanical movements to be generated under the action of an electrical signal: actuators are then spoken of. The most commonplace examples of these components are the printing heads of ink-jet printers, the fuel injectors used in motor vehicles, or the micro- or nano-positioning systems used in precision mechanics or in scientific equipment. In contrast, other systems use the sensitivity of mechanical elements to various stimuli to deliver electrical information allowing said stimuli to be quantified. Sensors are then spoken of. The most commonplace examples are in this case accelerometers, gyrometers, pressure sensors (microphones), inter alia. Lastly, a final category uses both effects simultaneously: a mechanical structure is made to vibrate under the influence of a periodic electrical signal; if the vibration of this mechanical structure is sufficiently stable, the transcription of this vibration to the electrical domain allows a stable oscillating system to be produced. Resonators are then spoken of. The most commonplace examples of these components are the quartz resonators used in the watch and clock making industry or the oscillators used to temporally synchronize electrical circuits.

All these electromechanical systems are based on the ability of the structure to transduce, i.e. the ability thereof to convert a signal generated in one domain (electrical domain, mechanical domain, etc.) into another domain (electrical domain, mechanical domain, etc.). A plurality of techniques are known, but one of the most commonplace is the use of piezoelectric materials. Piezoelectricity, which was discovered in 1880 by the Curie brothers (P. Curie, *Notice sur les travaux scientifiques de M. P. Curie*, Gauthier-Villars (1902)), is the ability of a crystal to polarize under the action of a mechanical stress, or vice versa to deform under the action of a voltage. Piezoelectric materials therefore allow electro-mechanical or mechano-electrical transduction to be achieved.

The founding work on piezoelectric components used natural crystals, such as quartz or Rochelle salt. These materials were immediately applied in the manufacture of resonators, and in the first sonar systems. Nevertheless, in the latter application, the piezoelectric properties of these materials proved to be too weak to allow high pressures to be generated in water, or conversely low acoustic pressures to be detected. Research therefore turned to the synthesis of artificial materials, the most used thereof still being at the present time lead zirconate titanate ($PbZr_xTi_{1-x}O_3$, or PZT) and the derivatives thereof. The high piezoelectricity of this material has allowed the development of sonar systems used in maritime transport or defence, echographic probes used in medical diagnostics, fuel injectors used in the automotive industry, or even sensing elements for non-destructive testing systems. Despite its excellent piezoelectric properties, this material has a few major drawbacks: since it is a compound based on lead, its synthesis, recycling and the dumping thereof in the natural environment raise problems with respect to environmental toxicology. Thus, standards such as RoHS (Restriction of the use of Hazardous Substances in electronic equipment) and the European directive WEEE (Waste Electrical and Electronic Equipment) tend to forbid its use over the long term. In addition, although this material has strong piezoelectric properties at low frequencies, its electrical and/or mechanical losses are unacceptable for high-frequency applications. Lastly, this material loses its piezoelectric properties at high temperature. Research has therefore turned toward alternative materials, such as lithium niobate or tantalate ($LiNbO_3$, $LiTaO_3$), potassium niobate ($KNbO_3$) and the derivatives thereof such as $KNa_{1-x}Nb_xO_3$, barium titanate ($BaTiO_3$) and the derivatives thereof such as $(Ba_{1-x}Ca_x)(Ti_{1-y}Zr_y)O_3$, sodium bismuth titanates ($Na_{0.5}Bi_{0.5}TiO_3$) or other exotic materials such as langasite, langatate or the derivatives thereof ($La_3Ga_5SiO_{14}$, $La_3Ga_{5.5}Ta_{0.5}O_{14}$, etc.).

In the 1980s, the appearance of micro-electro-mechanical systems (MEMS) opened the way to miniaturization of sensors, of actuators or of resonators, this benefiting the development of mobile telephony and of sensors for motor vehicles. The production of piezoelectric MEMS was made possible by the development of thin piezoelectric layers. These layers are characterized by a thickness of about one micron, or even less. Commonly, only a few often polycrystalline materials are available in the form of thin layers: zinc oxide (ZnO), aluminium nitride (AlN) or once again PZT. At the present time, the latter two materials are successfully used in industry.

Layers of aluminium nitride are currently mainly used to produce bulk acoustic wave filters. These filters are circuits that use a plurality of bulk acoustic wave resonators, which are based on resonance in a thickness mode of the piezoelectric layer, which is generally made of AlN. Specifically, for a long time the piezoelectric coefficients of this material were relatively in tune with the requirements of the applications of mobile telephony. Specifically, there is a relationship of proportionality between the electromagnetic coupling coefficient of a wave propagating through a piezoelectric material (this coupling coefficient been defined as being the ratio between the amount of energy converted from the electrical domain to the mechanical domain, or vice versa, and the amount of energy stored in electrical and mechanical form in the structure) and the relative bandwidth that it is possible to synthesize using a filter circuit. With the maturity of the technology of acoustic wave filters, and the arrival of new telecommunications standards (for example, 5th generation or 5G mobile telephony) the appearance of new frequency bands at high frequencies (above 3 GHz) and the appearance of relatively wide bands or of decreased spacing between the frequency bands used is being observed. In addition, research is currently active in the development of resonators or circuits of filters with frequency agility. All these particular cases require resonators that possess electromagnetic coupling coefficients that are higher than it is possible to achieve with aluminium nitride.

The development of alloys derived from AlN and incorporating, for example, scandium or chromium (AlScN or AlCrN) has therefore been witnessed over the last few years. The modification of the composition of the piezoelectric material allows piezoelectric coupling coefficients to be substantially increased (passage from about 6% to more than 10%) without major modification to fabrication processes. Nevertheless, the requirements are such that these improvements are still not entirely sufficient. It has therefore been proposed to base bulk acoustic wave resonators on materials such as lithium niobate or lithium tantalate. Lithium niobate in theory allows shear waves able to have electromagnetic coupling coefficients of as high as 45% to be excited. However, this is true only for certain very specific crystal orientations.

In practice, the most advanced work on this material is that of Kadota et al. (M. Kadota, Y. Suzuki and Y. Ito, *IEEE International Ultrasonics Symposium* 2010 or M. Kadota, T. Ogami, K. Yamamoto, H. Tochishita, Y. Negoro, *IEEE Transactions on Ultrasonics, Ferroelectrics and Frequency Control vol* 57, No. 11, p. 2564 (2010)), who have produced Lamb wave and bulk wave resonators from a stack consisting of a substrate/sacrificial layer/electrode/epitaxial film of lithium niobate/electrode. These layers of lithium niobate have a so-called c-axis orientation, corresponding to the crystal axis (000.6) or to the Z-direction according to standard ANSI/IEEE 176-1987. The electromagnetic coupling coefficients of this orientation are almost identical to those of aluminium nitride, and therefore it is of relatively little interest given how difficult it is to deposit this material. Specifically, the growth of this material requires high temperatures (about 500 to 700° C.) and a relatively long time (about a few hours), during which the risk of diffusion of lithium into the other layers present is high, making it tricky to control the chemical composition and the interfaces.

To get around these problems, a number of production processes are based on techniques for transferring thin single-crystal films. Thin layers are in this case sampled from a bulk single-crystal substrate in order to be incorporated into the stack of acoustic components. Three techniques exist:
bonding/thinning: the principle consists in bonding a piezoelectric substrate to the host substrate, then in thinning the piezoelectric material by mechanical grinding, followed by polishing. In certain cases, it is also possible to use etching steps to consume the material more rapidly;
bonding/fracturing: the principle consists in implanting light ions at a given depth in the piezoelectric substrate, and with a relatively high dose. This substrate is then bonded to the host substrate. A heat treatment then allows the interface where the implanted ions are trapped to be weakened, this causing the material to fracture. There then remains only, on one hand, a thin piezoelectric layer bonded to the host substrate and, on the other hand, the thinned donor piezoelectric substrate; bonding/dissolution: this variant of the preceding method consists in using the fact that the piezoelectric material is damaged by the localized presence at a certain depth of a high quantity of implanted ions. It is therefore in this location much more easily etched by chemical dissolution than the surrounding regions. This effect may then be used to detach the thin layer bonded to the host substrate from the rest of the piezoelectric substrate.

These three techniques have the advantage of providing single-crystal piezoelectric layers of excellent quality and indeed of virtually any crystal orientation (provided that single-crystal substrates having this orientation are available). They are therefore very versatile. Nevertheless, since they require bonding steps and resource-intensive treatments to achieve detachment of the layer that it is desired to preserve, the implementation thereof is relatively tricky. It in particular requires anneals to be carried out to consolidate the bonding interface, where appropriate to cause the fracture and lastly to heal damage of the material caused by the fracture, implantation, or even mechanical abrasion of the crystal. This may cause problems of compatibility with structures present on the host substrate, which run the risk of being degraded because of the thermal budget applied during the healing anneal. Another problem may also result from differences in expansion coefficients between the donor substrate (piezoelectric substrate) and the receiver substrate (ideally a substrate made of silicon), which, during attempts to apply the bonding/fracturing process, may cause wafer breakages, during the fracturing anneal when the two thick substrates experience a high thermal expansion differential. Lastly, a final limitation of these techniques resides in the fact that it is difficult to envision a transposition to substrates of large sizes (diameters of 200 or 300 mm): specifically, single-crystal piezoelectric substrates are best available at the present time with a diameter of 150 mm, and the acuteness of problems with expansion differentials increases as the lateral dimensions of the substrates increase.

Employing steps of deposition of the piezoelectric material would therefore be simpler. Nevertheless, obtaining a crystal orientation other than the natural growth orientation requires epitaxial growth on ad hoc surfaces, i.e. generally surface atomic arrangements compatible with the crystal planes of the piezoelectric material that it is desired to grow. The substrates must therefore undergo specific chemical and heat treatments to reveal atomic steps. These conditions are extremely restrictive and generally require the presence of layers that are themselves single-crystal or epitaxial and that have extremely controlled surface states. This is typically not the case for the stacks obtained after a succession of manufacturing steps, and is above all not the case of the metal electrodes on which it is generally desired to deposit the piezoelectric material, a fortiori when these electrodes have a given geometry and do not extend over the entire surface of the substrate. In addition, the growth of large thicknesses (several hundred nm to a few μm depending on the material) leads to relaxation of stresses due to the lattice mismatch between the substrate and the epitaxial layer, which leads to the formation of dislocations that may adversely affect the integrity of the film if they are too great in number. For this reason, the thickness of epitaxial films is generally limited. Moreover, as was mentioned above, there is a high probability of these structures being degraded because of the thermal budget required for the deposition, and of the chemical reactivity of the species present.

Patent application US 2017 0077386 A1 describes a technique allowing this problem to be avoided: the material is grown epitaxially on a growth substrate, optionally including sublayers for accommodating the epitaxial relationships between the substrate and the piezoelectric layer. The upper portion of the stack of the resonator is then formed. Apertures are then etched locally through the substrate, this allowing the resonator to be released and mechanically decoupled from the substrate. At the bottom of these apertures, the lower electrodes are then deposited and structured. However, this technique has a number of drawbacks: the substrates are greatly weakened by the etching of the apertures, this limiting the density of features that it is possible to produce. This therefore degrades the compactness of the filters and/or the fabrication yield;

certain growth substrates, sapphire for example, are notoriously difficult to etch to large depths because of their chemical inertia and their hardness. As a result, the etching step is costly, assuming that it is even possible to such large depths; the definition of the lower electrode features at the bottom of the cavities (depths of several hundred μm) is tricky, since the photolithography equipment then has to be used beyond its depth of field. The features will therefore possibly not be precisely defined.

SUMMARY OF THE INVENTION

For this reason, in this context, the Applicant provides, in the present invention, a process for producing micro-electromechanical components using a thin piezoelectric layer, this process being particularly well suited to the case of a thin epitaxial piezoelectric layer sandwiched between two electrodes, and allowing the lower electrode where appropriate not be degraded, and the drawbacks of the techniques presented above with respect to the prior art to be avoided.

More precisely, one subject of the present invention is a process for fabricating a micro-electro-mechanical system, comprising the following steps: production of a stack on the surface of a temporary substrate so as to produce a first assembly, comprising:
at least depositing a piezoelectric material or a ferroelectric material to produce a layer of piezoelectric material or of ferroelectric material;
producing a first bonding layer;
production of a second assembly comprising at least producing a second bonding layer on the surface of a host substrate;
production of at least one acoustic isolation structure in at least one of the two assemblies;
production of at least one electrode level containing one or more electrodes in at least one of the two assemblies;
bonding said two assemblies via said two bonding layers, before or after the production of the at least one electrode level in at least one of the two assemblies;
removing said temporary substrate.

According to variants of the invention, said piezoelectric material or said ferroelectric material is deposited by epitaxial growth.

According to variants of the invention, the micro-electromechanical system comprises at least one bulk acoustic wave resonator or at least one surface acoustic wave resonator or at least one Lamb wave resonator.

According to variants of the invention, the bonding comprises a step of thermal annealing.

According to variants of the invention, the operation of removing the temporary substrate comprises:
a step of thinning said temporary substrate;
an operation of chemically etching said thinned temporary substrate.

According to variants of the invention, the operation of removing said temporary substrate comprises:
a step of diffusing elements that cause precipitation or chemical reactions in the material from which said temporary substrate is made, or
a step of implanting ions into said temporary substrate.

According to variants of the invention, the process comprises depositing a buffer layer on the surface of said temporary substrate, prior to the deposition of said piezoelectric material or of said ferroelectric material.

According to variants of the invention, the process comprises:
producing a sacrificial layer above a dielectric material;
structuring said sacrificial layer so as to define a sacrificial layer structure; depositing a dielectric above said sacrificial layer structure;
removing said sacrificial layer structure so as to define said acoustic isolation structure.

According to variants of the invention, the dielectric material is an oxide that may be $SiO_2$, the sacrificial layer being made of amorphous silicon or of polysilicon.

According to variants of the invention, the production of the acoustic isolation structure comprises:
producing at least one sacrificial layer in said first assembly; releasing said sacrificial layer structure after bonding said two assemblies.

According to variants of the invention, the production of the acoustic isolation structure comprises producing a Bragg mirror structure.

According to variants of the invention, the process comprises the production of structured layers made of metal and possibly of molybdenum, said structured layers being inserted into the dielectric that may be $SiO_2$.

According to variants of the invention, the process comprises:
prior to said bonding of the two assemblies, producing at least one so-called lower electrode on the surface of said layer of piezoelectric material or of ferroelectric material and producing an acoustic isolation structure in said first assembly; after removing said temporary substrate, producing at least one so-called upper electrode on said layer of piezoelectric material or of ferroelectric material.

According to variants of the invention, the process comprises, prior to said bonding of said two assemblies:
producing electrodes on the surface of said layer of piezoelectric material or of ferroelectric material;
producing an acoustic isolation structure in said second assembly.

According to variants of the invention, the piezoelectric material is $LiNbO_3$ or $LiTaO_3$ or solid solutions thereof, or $KNbO_3$ or AlN or GaN.

According to variants of the invention, the ferroelectric material is: $LiNbO_3$ or $LiTaO_3$ or PZT.

According to variants, the temporary substrate is made of a material that is not silicon, such as, for example, the materials MgO, $SrTiO_3$, $LaAlO_3$, LSAT $((LaAlO_3)_{0.3}(Sr_2TaAlO_6)_{0.7})$, $DyScO_3$, sapphire $(Al_2O_3)$, lithium niobate $(LiNbO_3)$ or lithium tantalate, the piezoelectric material possibly advantageously being PZT.

According to variants of the invention, the bonding layers are made of oxide or made of polymer.

Another subject of the invention is a micro-electro-mechanical system obtained using the process of the invention.

BRIEF DESCRIPTION OF THE DRAWINGS

The invention will be better understood and other advantages will become apparent on reading the following non-limiting description, and by virtue of the appended figures, in which.

DETAILED DESCRIPTION

Figure 1A:
FIG. 1a illustrates the first step of a first example of a process for producing a system comprising a bulk wave resonator according to the invention comprising a released sacrificial structure.

Thus the process of the present invention comprises the following main steps, in versions according to certain variants and certain options: preparing a temporary substrate that is a suitable growth substrate. This may require the surface of the substrate to be treated and/or layers for matching epitaxial relationships between the layer to be deposited and the growth substrate to be deposited; depositing the piezoelectric or ferroelectric layer using a suitable technique, in order to make grow a single-crystal or at the very least textured material; producing the lower portion of the component above the deposited layer, or on another substrate (the future host substrate). This lower portion may comprise electrodes or the like, or at least a structure for acoustically isolating the acoustic wave resonator that will be formed: release well that will allow an air cavity to be inserted under the resonator or Bragg mirror; bonding the growth substrate comprising the epitaxial layer where appropriate and some of the structures of the lower portion of the component to the host substrate, which optionally possesses the rest of this lower portion (possibly a sacrificial layer structure, at least one electrode, etc.); detaching the temporary substrate, which may be a growth substrate, by means known to those skilled in the art (chemical or physical etching of the substrate or of one of the layers incorporated into the growth substrate); completing the fabrication of the component by producing the upper portion of the component.

The Applicant describes below a plurality of examples of processes, the steps of which are illustrated by the figures, in which the same references have been employed, which references correspond to the following elements, respectively:

100: a temporary substrate
200: a buffer layer
300: a layer of piezoelectric material or of ferroelectric material
400: at least one lower electrode
500a, 500b, 500c→500: dielectric material, in particular intended for bonding
600: a sacrificial layer structure
MR: a Bragg mirror structure
700: a host substrate
800: at least one upper electrode
900: an upper dielectric layer
1000: contact pads The examples below are described in the context of piezoelectric materials, but may equally well be applied in the context of ferroelectric materials.

Example of a process for fabricating a bulk wave resonator according to the invention comprising a released sacrificial structure:

Step 1.1:
A silicon substrate corresponding to the temporary substrate 100 is prepared via a high-temperature anneal (temperature >1000° C.) in order to obtain a surface that is smooth on the atomic level, as illustrated in FIG. 1a.

Figure 1B:
FIG. 1b illustrates the second step of a first example of a process for producing a system comprising a bulk wave resonator according to the invention comprising a released sacrificial structure.

Step 1.2:
A buffer layer 200, for example of ZnO and of a thickness for example of 20 nm, is deposited by molecular beam epitaxy (MBE), as illustrated in FIG. 1b.

Figure 1C:
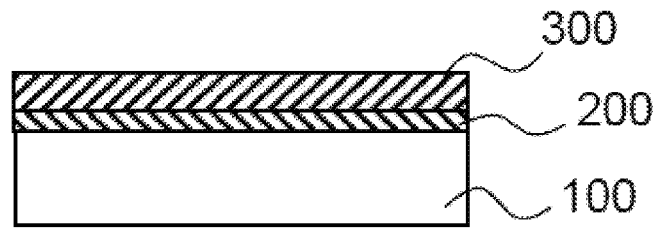
FIG. 1c illustrates the third step of a first example of a process for producing a system comprising a bulk wave resonator according to the invention comprising a released sacrificial structure.

Step 1.3:
A layer of $LiNbO_3$ for example of 250 nm thickness is deposited by pulsed injection metal-organic chemical vapour deposition (PI-MOCVD). The lattice match between the $Si/ZnO/LiNbO_3$ for example leads to growth of a layer of c-axis lithium niobate 300, as illustrated in FIG. 1c.

Figure 1D:
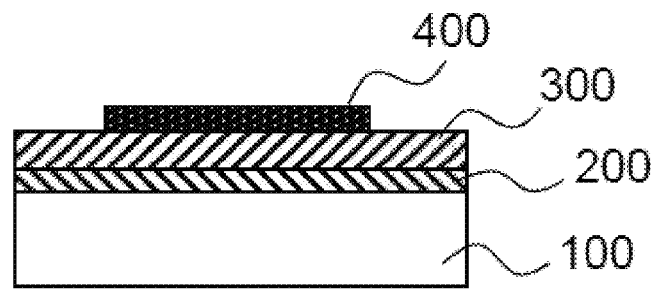
FIG. 1d illustrates the fourth step of a first example of a process for producing a system comprising a bulk wave resonator according to the invention comprising a released sacrificial structure.

Step 1.4:
A lower electrode 400, which is for example made of molybdenum of 100 nm thickness, is deposited by sputtering, then structured by photolithography, reactive ion etching and resist removal, as illustrated in FIG. 1d.

Figure 1E:
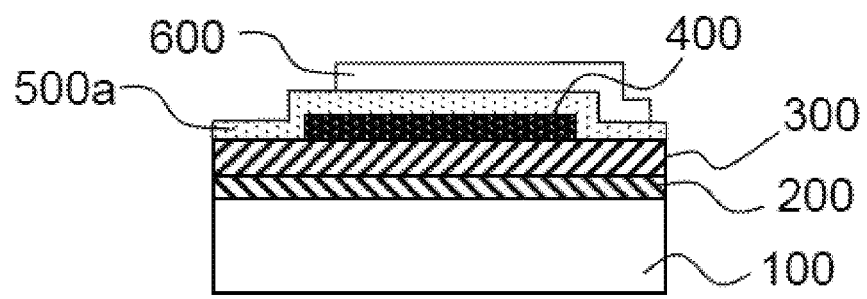
FIG. 1e illustrates the fifth step of a first example of a process for producing a system comprising a bulk wave resonator according to the invention comprising a released sacrificial structure.

Step 1.5:
A protective dielectric layer made of $SiO_2$ 500a, for example of 100 nm thickness, is deposited for example by plasma-enhanced chemical vapour deposition (PECVD), then a sacrificial layer made of amorphous silicon, for example of 1 μm thickness, is deposited by sputtering. The latter is structured by photolithography, reactive ion etching and resist removal, to obtain a sacrificial layer structure 600 as illustrated in FIG. 1e.

Figure 1F:
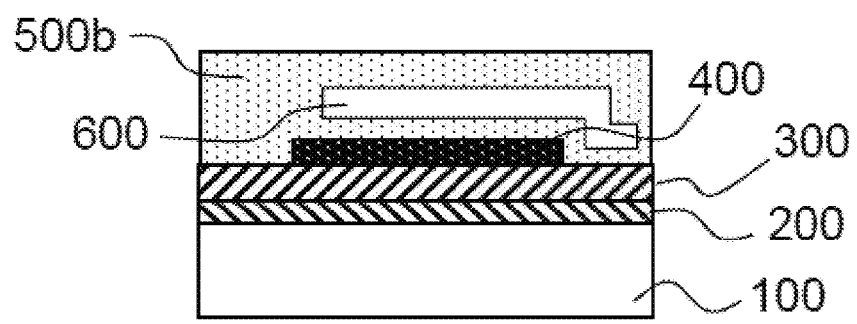
FIG. 1f illustrates the sixth step of a first example of a process for producing a system comprising a bulk wave resonator according to the invention comprising a released sacrificial structure.

Step 1.6:
$SiO_2$ dielectric 500b, for example of 2 μm thickness, for example is deposited by reactive sputtering of Si using an $Ar/O_2$ plasma and chemical-mechanical polishing (CMP), as illustrated in FIG. 1f.

Figure 1G:
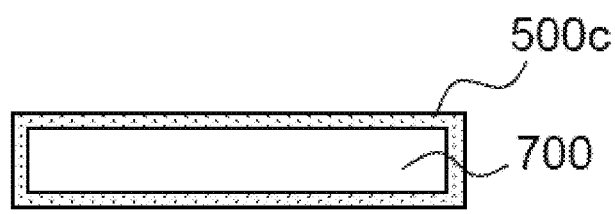
FIG. 1g illustrates the seventh step of a first example of a process for producing a system comprising a bulk wave resonator according to the invention comprising a released sacrificial structure.

Step 1.7:
Moreover, a substrate covered with a layer 500c by thermal oxidation of a silicon host substrate 700, for example such as to achieve a thickness of 500 nm, is prepared as illustrated in FIG. 1g.

Figure 1H:
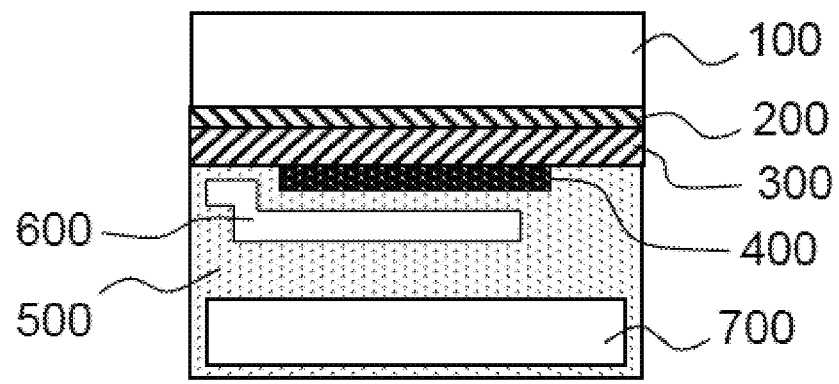
FIG. 1h illustrates the eighth step of a first example of a process for producing a system comprising a bulk wave resonator according to the invention comprising a released sacrificial structure.

Step 1.8:
The surfaces are activated and the host substrate 700 and the temporary substrate 100, which corresponds to a growth substrate, are then direct bonded, after which an annealing operation is carried out to consolidate the bond achieved via the dielectric 500, as illustrated in FIG. 1h.

Step 1.9:
An operation for detaching the temporary growth substrate 100 is carried out.

Figure 1I:
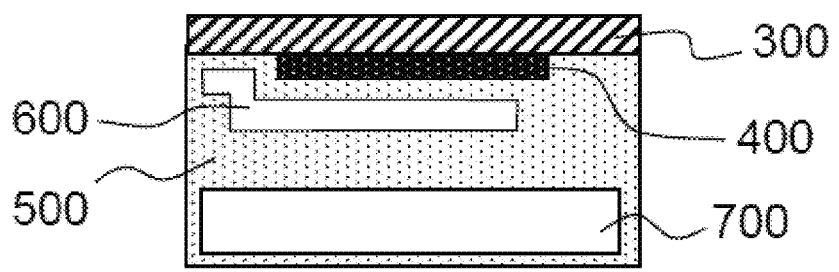
FIG. 1i illustrates the ninth step of a first example of a process for producing a system comprising a bulk wave resonator according to the invention comprising a released sacrificial structure.

Thinning by mechanical grinding that aims to leave only about ten microns of thickness, then chemical etching of the temporary growth substrate in a tetramethyl ammonium hydroxide (TMAH) solution and chemical etching of the ZnO buffer layer 200 for example with HCl are carried out, as illustrated in FIG. 1i.

Figure 1J:
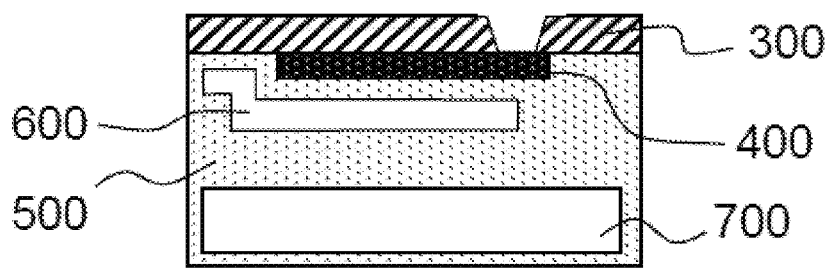
FIG. 1j illustrates the tenth step of a first example of a process for producing a system comprising a bulk wave resonator according to the invention comprising a released sacrificial structure.

Step 1.10:
The etch intended for electrical contacts down to the lower electrode is carried out by photolithography, ion-beam etching (IBE) of the piezoelectric layer 300, and resist removal, as illustrated in FIG. 1j.

Figure 1K:
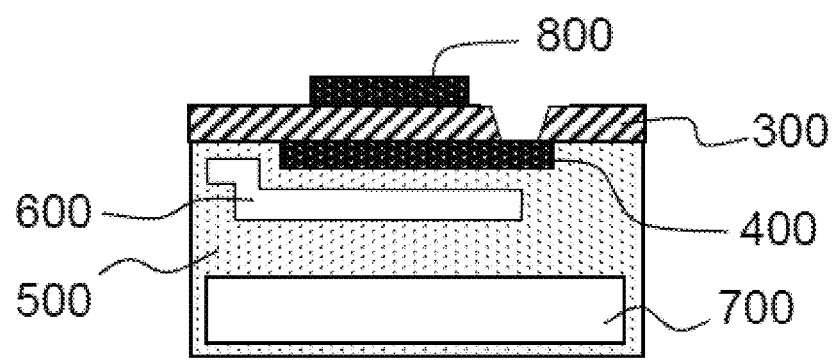
FIG. 1k illustrates the eleventh step of a first example of a process for producing a system comprising a bulk wave resonator according to the invention comprising a released sacrificial structure.

Step 1.11:
An upper electrode 800 (again made of Mo, for example of 100 nm thickness) is deposited and structured, as illustrated in FIG. 1k.

Figure 1L:
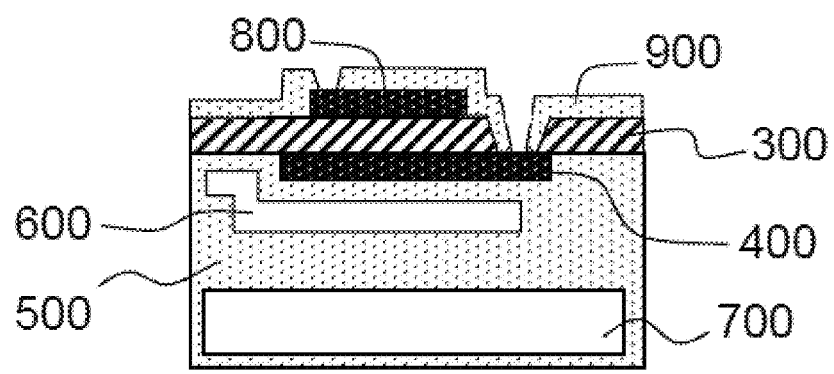
FIG. 1l illustrates the twelfth step of a first example of a process for producing a system comprising a bulk wave resonator according to the invention comprising a released sacrificial structure.

Step 1.12:
The upper electrode is then encapsulated with a layer of $SiO_2$ 900 that is for example deposited by PECVD, and for example once again of 100 nm thickness. Next, apertures for electrical contacts are produced in the film by photolithography, reactive ion etching and resist removal, as illustrated in FIG. 1l.

Figure 1M:
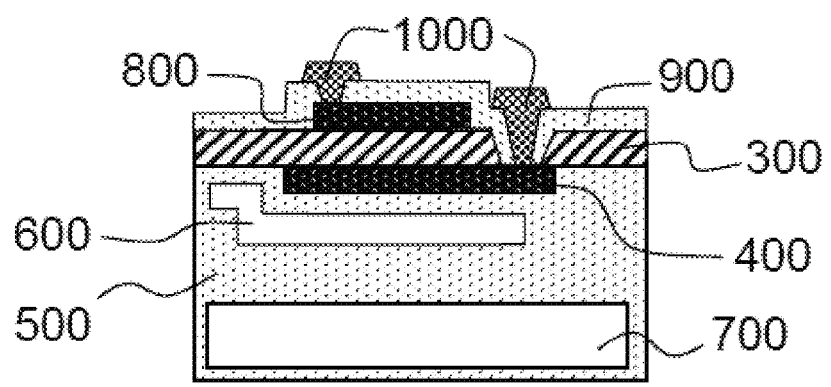
FIG. 1m illustrates the thirteenth step of a first example of a process for producing a system comprising a bulk wave resonator according to the invention comprising a released sacrificial structure.

Step 1.13:
Electrical contacts 1000, which are for example made of aluminium, of 1 μm thickness, are deposited by sputtering, photolithography, chemical etching and resist removal, as illustrated in FIG. 1m.

Figure 1N:
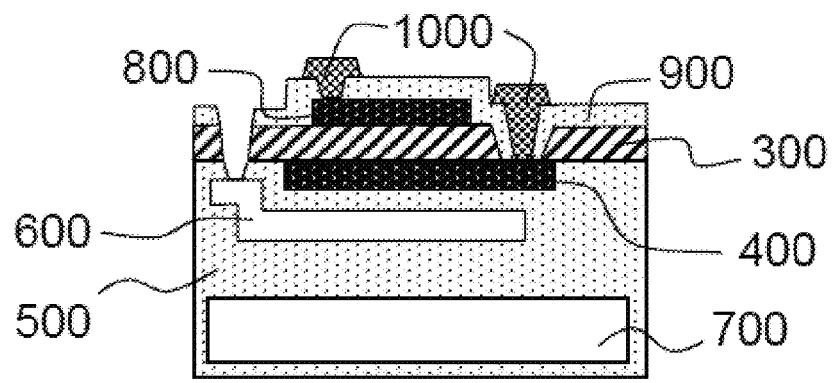
FIG. 1n illustrates the fourteenth step of a first example of a process for producing a system comprising a bulk wave resonator according to the invention comprising a released sacrificial structure.
Figure 1O:
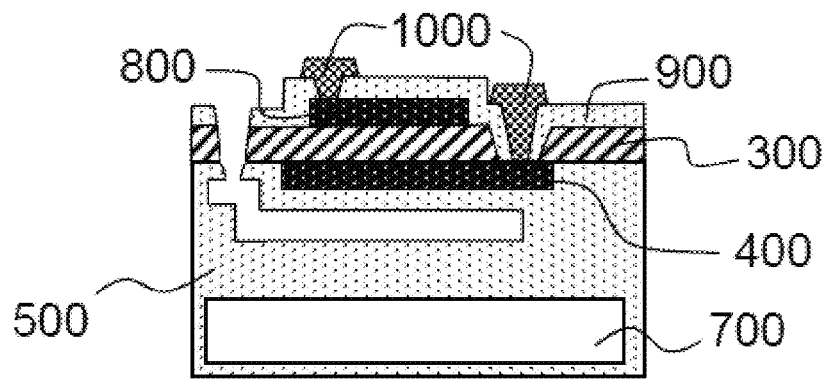
FIG. 1o illustrates the fifteenth step of a first example of a process for producing a system comprising a bulk wave resonator according to the invention comprising a released sacrificial structure.

Step 1.14:
Release apertures are etched by ion-beam etching of an $SiO_2/LiNbO_3/SiO_2$ stack as illustrated in FIG. 1n.

Step 1.15:
The resonator (layer of piezoelectric material between electrodes) is then released by etching the sacrificial layer structure made of amorphous silicon 600 with $XeF_2$ gas as illustrated in FIG. 10.

Step 1.16:
Lastly, a voltage is applied to the terminals of the component and the latter is heated in order to orient the ferroelectric domains in the layer of lithium niobate in a preferred direction.

Example of a process for producing a bulk acoustic wave resonator from epitaxial lithium niobate on a Bragg mirror A variant of the preceding production process consists in replacing the acoustic confinement provided by the air cavity located under the resonator with acoustic confinement provided by a Bragg mirror consisting of a stack of alternating layers of high and low acoustic impedances. Among the materials possessing a high acoustic impedance, layers of tungsten (W), of molybdenum (Mo), of silicon nitride (SiN) or of aluminium nitride (AlN) are conventionally considered. As regards materials possessing a low acoustic impedance, the literature above all mentions the use of silicon oxide ($SiO_2$), but also mentions silicon oxycarbide (SiOC). These lists are not limiting.

Figure 2A:
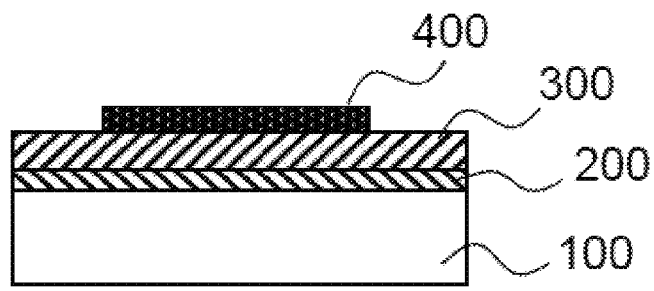
FIG. 2a illustrates the first step of a second example of a process for producing a system comprising a bulk wave resonator according to the invention comprising a Bragg mirror structure.

A process suitable for producing solidly mounted resonators (SMR), name given to bulk wave resonators mounted on Bragg mirrors, is described below:

Step 2.1:
Steps 1.1 to 1.4 of the first process are carried out until lower electrodes have been produced such as illustrated in FIG. 2a, so as to define, on a temporary substrate 100, a buffer layer 200, a layer of piezoelectric material 300 and a lower electrode 400.

Figure 2B:
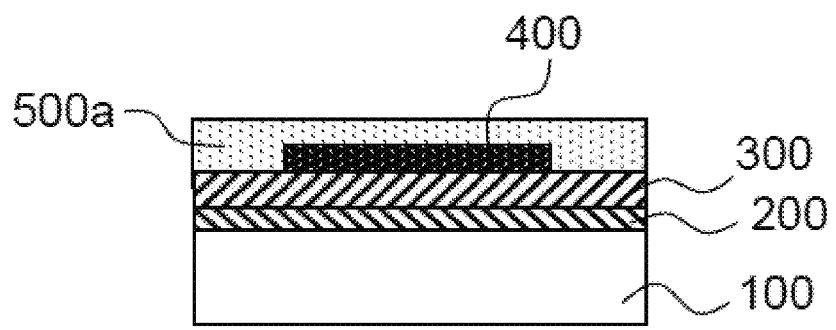
FIG. 2b illustrates the second step of a second example of a process for producing a system comprising a bulk wave resonator according to the invention comprising a Bragg mirror structure.

Step 2.2:
As illustrated in FIG. 2b, a protective layer made of $SiO_2$ 500a, for example of 600 nm thickness, is obtained by deposition, for example by plasma-enhanced chemical vapour deposition (PECVD), and planarization of the topography caused by the lower electrode. The remainder of the $SiO_2$ layer will play the role of upper layer of the Bragg mirror.

Figure 2C:
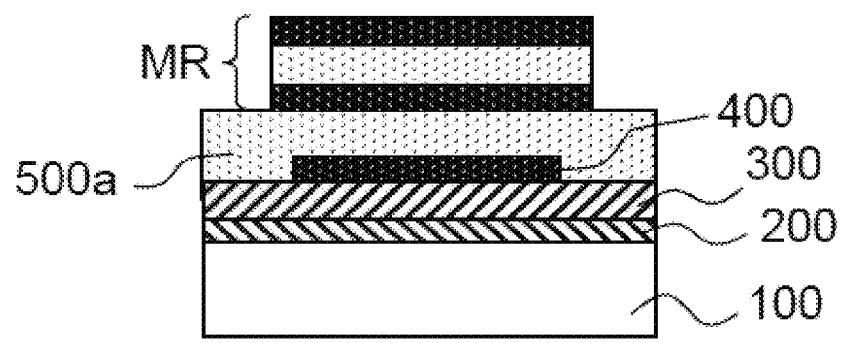
FIG. 2c illustrates the third step of a second example of a process for producing a system comprising a bulk wave resonator according to the invention comprising a Bragg mirror structure.

Step 2.3:
The subsequent constituent layers of the Bragg mirror MR, here for example an $SiO_2$/Mo (250 nm)/$SiO_2$ (250 nm)/Mo (400 nm) mirror, are then deposited. Next photolithography operations and reactive ion etching of the Mo/$SiO_2$/Mo trilayer are carried out as illustrated in FIG. 2c.

Figure 2D:
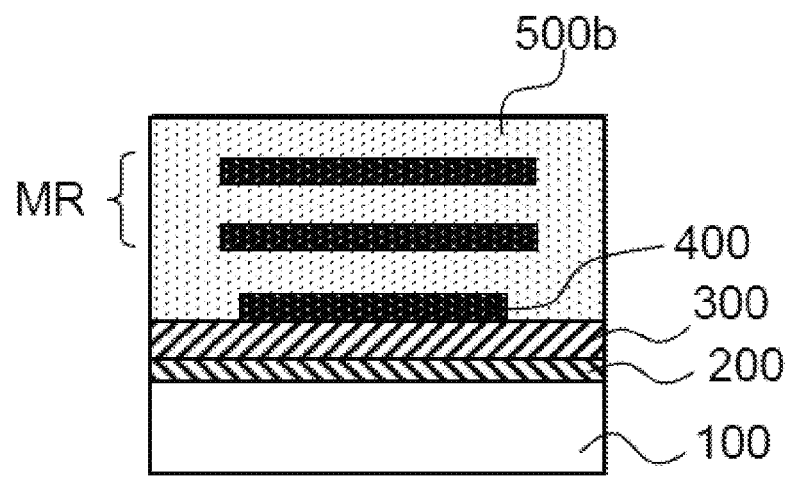
FIG. 2d illustrates the fourth step of a second example of a process for producing a system comprising a bulk wave resonator according to the invention comprising a Bragg mirror structure.

Step 2.4:
A layer of 2 μm of $SiO_2$ 500b is deposited, for example by PECVD, and the topography caused by the Bragg mirror MR is planarized as illustrated in FIG. 2d.

Figure 2E:
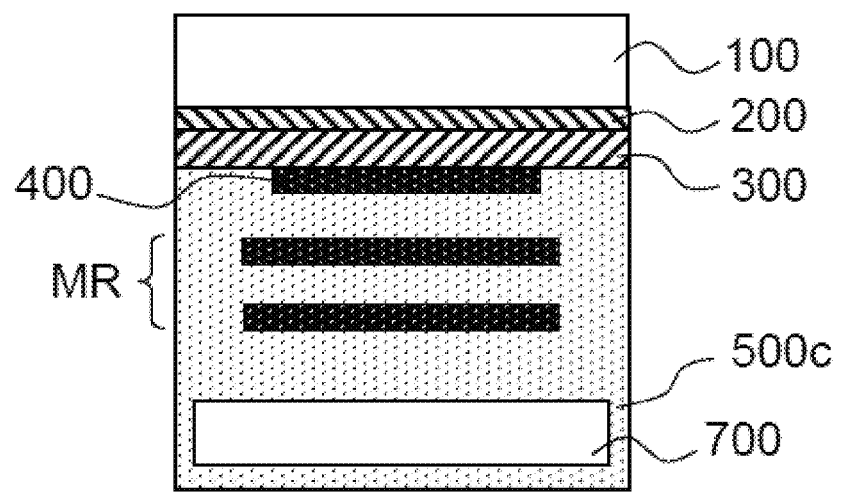
FIG. 2e illustrates the fifth step of a second example of a process for producing a system comprising a bulk wave resonator according to the invention comprising a Bragg mirror structure.

Step 2.5:
The surfaces are activated and the host substrate 700+500c (a substrate of silicon oxide) and temporary growth substrate 100 with the Bragg mirror MR are direct bonded. Annealing operations are carried out to consolidate the bond, as illustrated in FIG. 2e.

Figure 2F:
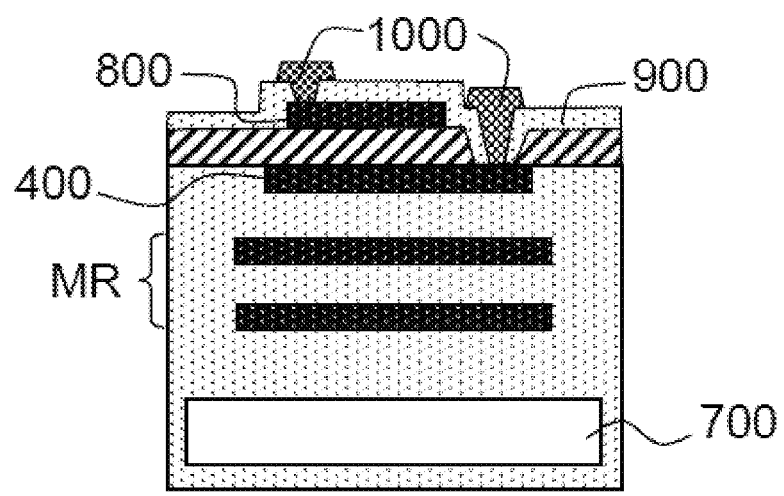
FIG. 2f illustrates the sixth step of a second example of a process for producing a system comprising a bulk wave resonator according to the invention comprising a Bragg mirror structure.

Step 2.6:
The temporary growth substrate 100 is detached as in the preceding embodiment, then the steps continue similarly to those of the production process until the electrical contacts have been finalized. Because of the presence of a Bragg mirror MR instead of the well of sacrificial layer, the releasing step is no longer required, as illustrated in FIG. 2f.

Example of a process for producing a Lamb wave resonator from epitaxial lithium niobate The processes described above do not apply solely to bulk acoustic wave resonators, but may also be used to produce Lamb acoustic wave resonators, which are also referred to as plate wave resonators. These resonators differ in that the acoustic waves are no longer excited by two unapertured electrodes that sandwich the piezoelectric layer, but by two interdigitated comb-shaped electrodes that are positioned on one of the (top or bottom) faces of the piezoelectric layer. The other face may make contact with an electrode covering the surface of the component (in order to excite Lamb waves from the vertical electric field thus formed) or, in contrast, comprise no electrodes, in order to excite waves from the horizontal electric field formed between the electrodes of the interdigitated comb. More generally, this process may apply to any family of acoustic micro-resonators that would benefit from an epitaxial piezoelectric layer.

Moreover, variant embodiments may be introduced into the preceding processes. In particular, other techniques for detaching the growth substrate are envisionable.

Specifically, step 1.9) of the first examplaric method is based on chemical etching of the growth substrate. In the case where the latter is not made of silicon and is therefore difficult to dissolve chemically, or to save time, it may be advantageous to carry out thinning mechanically by means of grinding and chemical-mechanical polishing techniques. A drawback remains however: the process leads to a consumption of the growth substrate, and therefore to its loss, this resulting in a notable cost. In order to avoid this problem, it may be advantageous to cause a mechanical fracture of the growth substrate, which will then be able to be reused provided that suitable reconditioning steps are carried out. This fracture may be obtained in various ways. Mention may be made of the following:

generation of a fragile interface during the growth of the piezoelectric layer. This may mainly occur when diffusion of an element that causes precipitation or chemical reactions that lead to the volume of one of the encapsulated materials present to increase, and therefore to spontaneous debonding on application of a mechanical stress, is assisted;

another technique consists in forming a fragile interface after the growth of the piezoelectric layer. This interface may be formed by implanting ions in the growth substrate, then carrying out a thermal anneal to cause the material to fracture, using a process similar to the Smart Cut™ process. This is possible when the epitaxial layer and the set of sublayers for accommodating the lattice parameters have a relatively small thickness, so as to be able to be passed through by the flux of ions during the implantation.

Figure 3A:
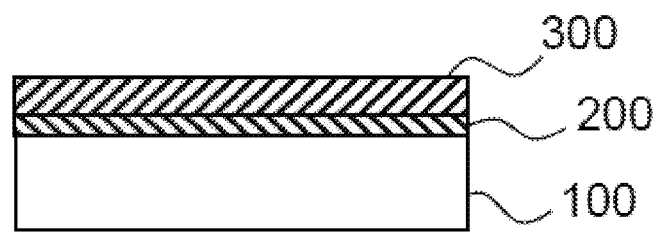
FIG. 3a illustrates the first step of an example of a process for producing a system comprising a Lamb wave resonator according to the invention.

Thus, one variant production process intended for example to produce a Lamb acoustic wave resonator is described hereinafter:

Step 3.1:
A layer of lithium niobate 300 is grown epitaxially on silicon, this epitaxial growth including growth of a buffer layer 200 allowing accommodation of the lattice mismatch between the lithium niobate and the temporary substrate made of silicon 100 (steps identical to steps 1.1 to 1.3 described in the first examplaric process), as illustrated in FIG. 3a.

Figure 3B:
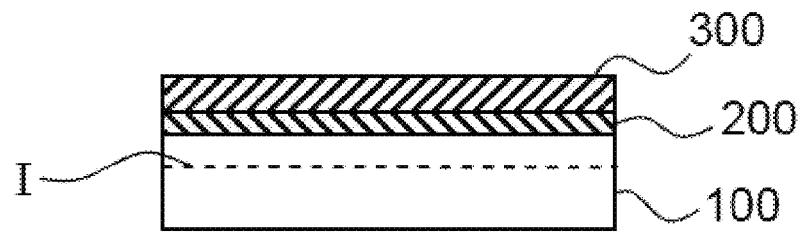
FIG. 3b illustrates the second step of an example of a process for producing a system comprising a Lamb wave resonator according to the invention.

Step 3.2:
Helium and hydrogen ions are then implanted through the epitaxial layer, so as to form a fragile interface I inside the silicon substrate, as illustrated in FIG. 3b.

Figure 3C:
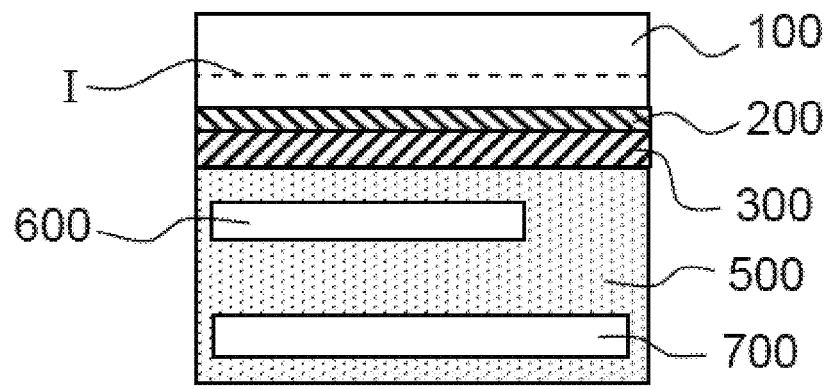
FIG. 3c illustrates the third step of an example of a process for producing a system comprising a Lamb wave resonator according to the invention.

Step 3.3:
At this stage of the process, it is possible to optionally form electrodes and a passivating layer, and to form release wells 600 made of sacrificial layer, then to bond, via the dielectric 500 the donor substrate to the host substrate 700, in the same way as in steps 1.4 to 1.8 of the process above. In the present case, the resonator has no lower electrode under the piezoelectric layer, as illustrated in FIG. 3c.

Figure 3D:
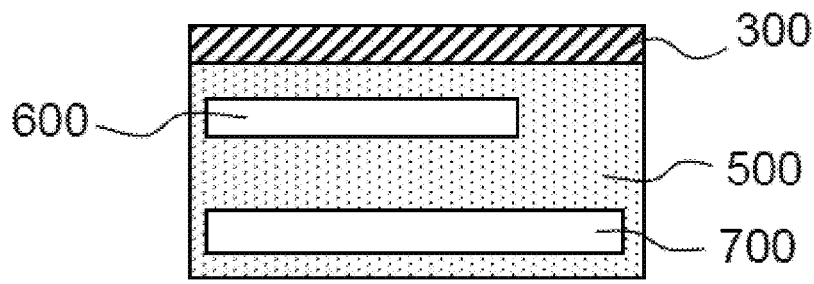
FIG. 3d illustrates the fourth step of an example of a process for producing a system comprising a Lamb wave resonator according to the invention.

Step 3.4:
The temporary growth substrate 100 is then detached. In this example, an anneal is carried out that allows the growth substrate to be fractured at the interface I weakened by ion implantation. Next, the thin layer of growth substrate remaining attached to the structure and the buffer layer are chemically etched, as illustrated in FIG. 3D. In the case of a growth substrate made of silicon, a TMAH solution allows the residual silicon to be removed, and the chemical etch of the buffer layer may be carried out using an HCl or $H_3PO_4$ solution if it is a question of ZnO.

Figure 3E:
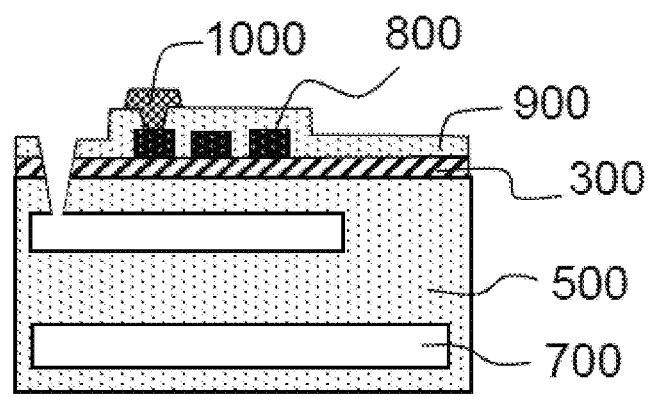
FIG. 3e illustrates the fifth step of an example of a process for producing a system comprising a Lamb wave resonator according to the invention.

Step 3.5:
The fabrication of the component is finalized. To do this, steps 1.10 to 1.16 of the above process are carried out as illustrated in FIG. 3e, which shows the Lamb wave resonator thus produced with a single electrode level 800 on the layer 300, one dielectric layer 900 and contact pads 1000, on the host substrate 700.

The above examples of the process relate to the production of components from epitaxial lithium niobite layers.

The present invention may also be used with other materials able to be grown epitaxially. Mention may for example be made of the materials AlN, GaN, $LiTaO_3$, $KNbO_3$, etc.

The approach of the invention is however in no way limited to epitaxial layers. It may a priori be applied to any type of deposited layer, provided that the incorporation of the deposition step into the complete integration of the component is complex (for example, very high temperature deposition in the presence of metals and/or on a surface having a topography).

An example of this type of situation is that of the use of thin layers of PZT to producing piezoelectric micro-transformers. This type of component is similar to the Lamb wave resonators described above, but is composed of two inter-digitated comb transducers, one corresponding to the primary of the transformer, and the other to the secondary. The Lamb waves then ensure the transfer of power from the primary to the secondary. In order to effectively excite these waves in the PZT, it is necessary to provide a lower electrode. To ensure the electrical isolation of the primary and secondary, it is therefore necessary to produce two separate lower electrodes, and therefore to pattern the lower metal level. However, conventional PZT growth processes (sol-gel process, cathode sputtering or laser ablation, etc.) are generally optimized for growth on a metal film (generally of platinum) covering the entirety of the substrate. In particular, it has been observed that depositing PZT on patterned electrodes causes a certain number of problems: the nature of the surface on which the PZT film is deposited differs depending on whether it is a question of metal surface (textured Pt) or of the surface of another sublayer (amorphous $SiO_2$ or partially textured $TiO_2$, etc.); moreover, the coefficients of thermal expansion of the materials present are different. All this leads to the appearance of residual strains that differ between the metallized regions and non-metallized regions. Moreover, the presence of metal may form a barrier to the diffusion of certain elements (Pb in particular). Parasitic phases (polychloride phase deficient in Pb) are therefore observed to appear in the non-metallized regions, this being unacceptable in terms of fabrication and operation of the components. Even though the insertion of suitable sublayers allows this problem to be partially solved, as described in the article M. Bousquet, B. Viala, H. Achard, J. Georges, A. Reinhardt, E. Nolot, G. Le Rhun, E. Defaÿ, *Pt-less silicon integration of PZT sol-gel thin films for microelectronics*, Electroceramics XIV, 2014, it still remains tricky to obtain an identical material in the metallized and non-metallized regions.

The present invention allows this problem to be solved. Specifically it allows a PZT film to be deposited on a growth substrate covered with an unapertured sheet electrode, then this film to be transferred to a host substrate that incorporates, for its part, a patterned electrode. Moreover, the present invention allows the PZT films to be grown using non-silicon substrates, such as for example substrates of MgO, of $SrTiO_3$, of $LaAlO_3$, of LSAT ($(LaAlO_3)0.3$ $(Sr2TaAlO6)0.7$), of $DyScO_3$, of sapphire ($Al2O3$) or of lithium niobate ($LiNbO_3$) or of lithium tantalate ($LiTaO_3$). These single-crystal substrates have the advantage of allowing epitaxial growth of the PZT, rather than polycrystalline growth as encountered with most films deposited on silicon. In addition, the choice of the substrate allows the crystal orientation of the deposited film, the structure of the ferroelectric domains (proportion of ferroelectric domains with a/c orientation) and the Curie temperature of the material formed to be modulated.

Example of a Process for Producing a Piezoelectric Transformer Made of PZT

Figure 4A:
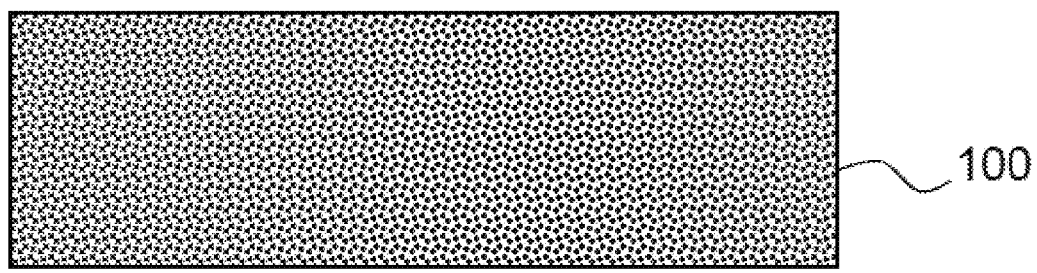
FIG. 4a illustrates the first step of an example of a process for producing a converter comprising two Lamb wave resonators according to the invention.

Step 4.1:
An $SrTiO_3$ substrate 100 is prepared: chemical treatment ($H_2O$+buffered HF)+high-temperature anneal (temperature >1000° C.) in order to obtain atomic surface steps ($TiO_2$ surface planes), such as illustrated in FIG. 4a.

Figure 4B:
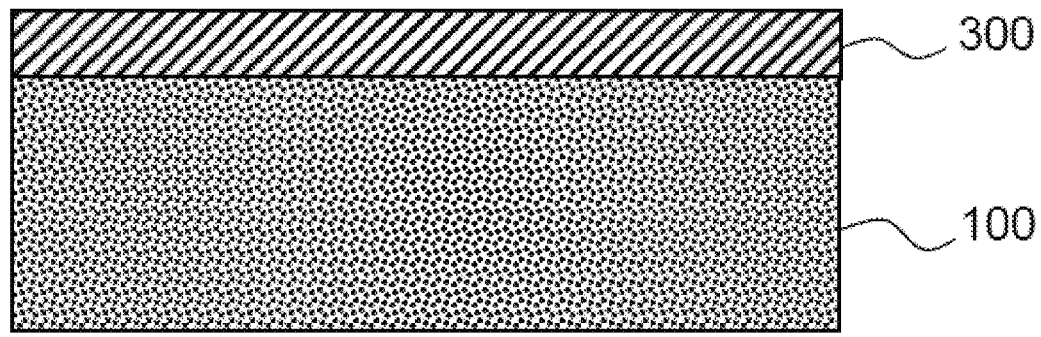
FIG. 4b illustrates the second step of an example of a process for producing a converter comprising two Lamb wave resonators according to the invention.

Step 4.2:
A PZT layer 300 is deposited, for example by laser ablation, cathode sputtering or sol-gel processing, and preferably with a thickness of 2 μm, as illustrated in FIG. 4b.

Figure 4C:
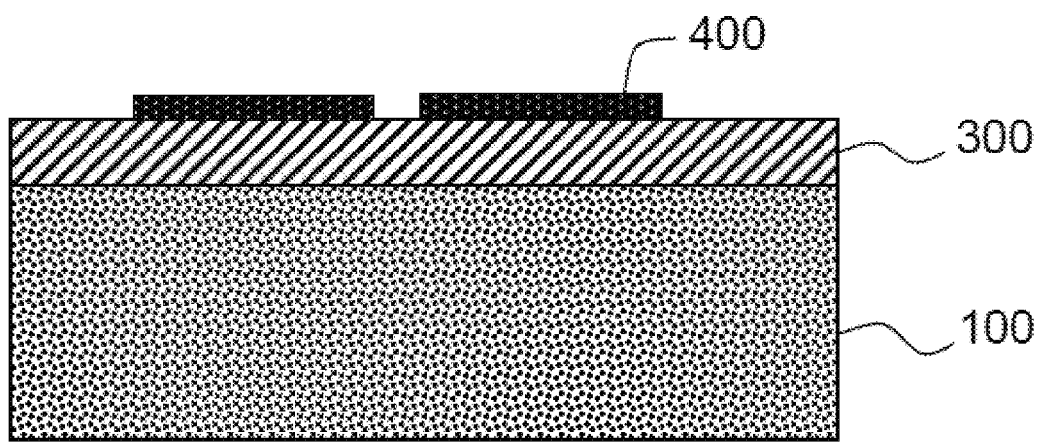
FIG. 4c illustrates the third step of an example of a process for producing a converter comprising two Lamb wave resonators according to the invention.

Step 4.3:
A metal layer, for example one made of ruthenium of 100 nm thickness, is deposited by sputtering, then this layer is structured to define the lower electrodes 400 by photolithography, reactive ion etching and resist removal, as illustrated in FIG. 4c.

Figure 4D:
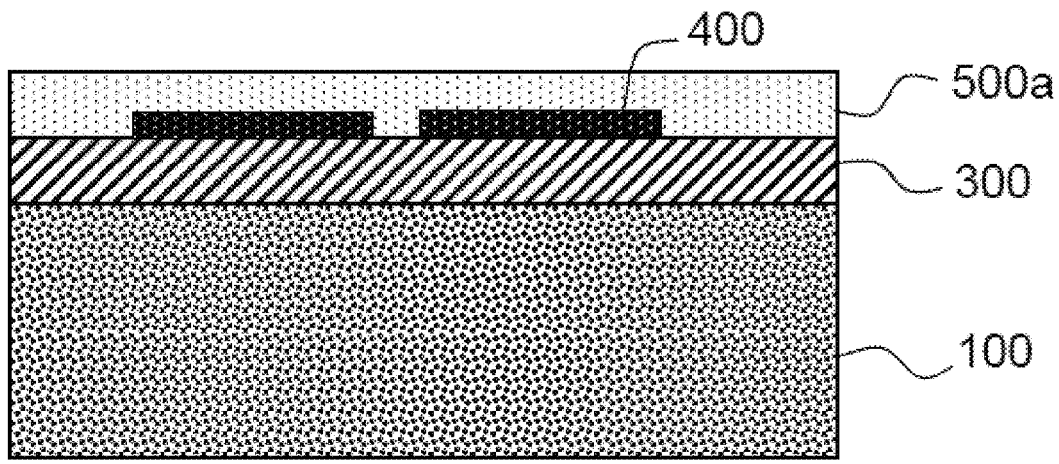
FIG. 4d illustrates the fourth step of an example of a process for producing a converter comprising two Lamb wave resonators according to the invention.

Step 4.4:
A planarizing layer 500a made of $SiO_2$ is deposited by PECVD and polished, as illustrated in FIG. 4d.

Figure 4E:
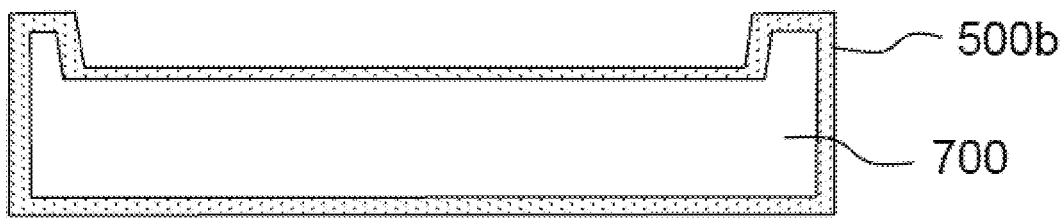
FIG. 4e illustrates the fifth step of an example of a process for producing a converter comprising two Lamb wave resonators according to the invention.

Step 4.5:
Photolithography operations, then reactive ion etching of a silicon host substrate 700 covered with an oxide layer 500b are also carried out in order to define cavities, for example of 3 μm depth, as illustrated in FIG. 4e.

Figure 4F:
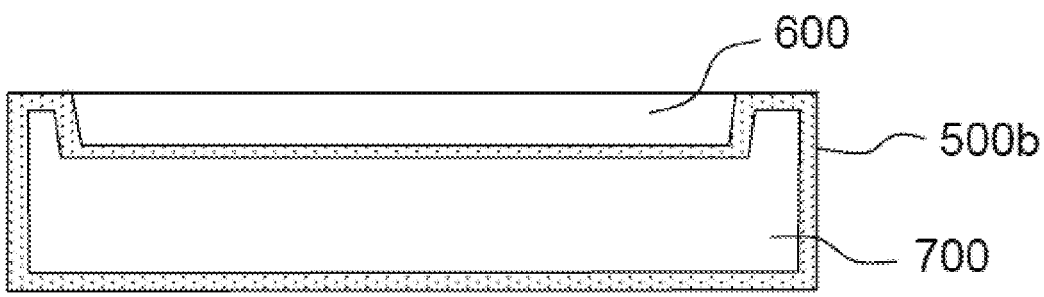
FIG. 4f illustrates the sixth step of an example of a process for producing a converter comprising two Lamb wave resonators according to the invention.

Step 4.6:
As illustrated in FIG. 4f, polysilicon of a thickness of 3 μm is deposited in the cavities defined beforehand so as to produce a sacrificial polysilicon structure 600, then a planarizing operation is carried out.

Figure 4G:
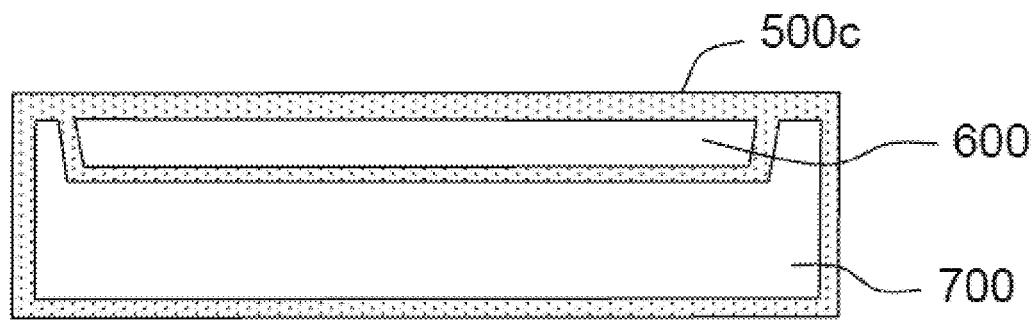
FIG. 4g illustrates the seventh step of an example of a process for producing a converter comprising two Lamb wave resonators according to the invention.

Step 4.7:
A new thermal operation is carried out in order to encapsulate the sacrificial structure 600 with 200 nm of oxide 500c, as illustrated in FIG. 4g.

Figure 4H:
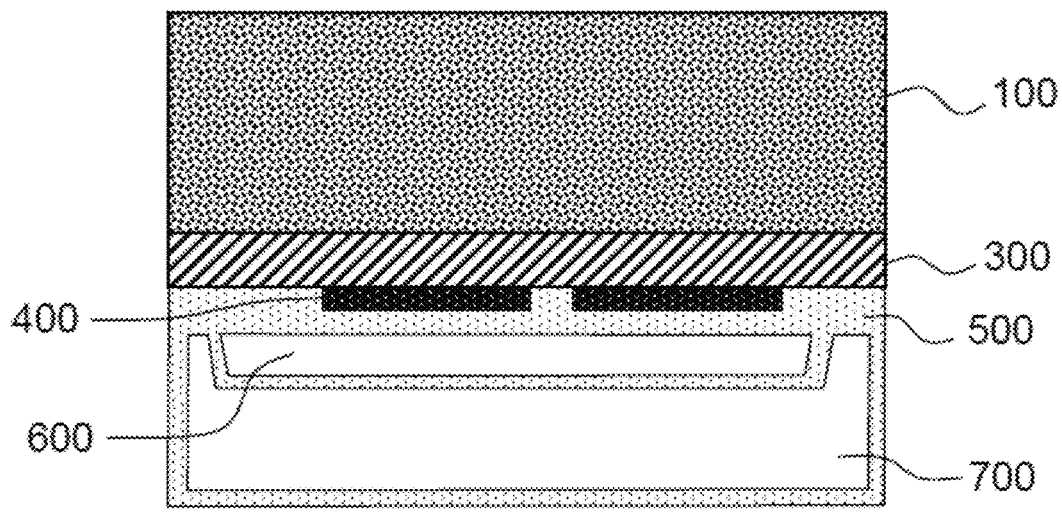
FIG. 4h illustrates the eighth step of an example of a process for producing a converter comprising two Lamb wave resonators according to the invention.

Step 4.8:
As illustrated in FIG. 4h, the temporary growth substrate 100 is bonded to the silicon host substrate 700, with alignment of the electrode features 400 with the polysilicon wells 600, and then an anneal is carried out to consolidate the substrate.

Figure 4I:
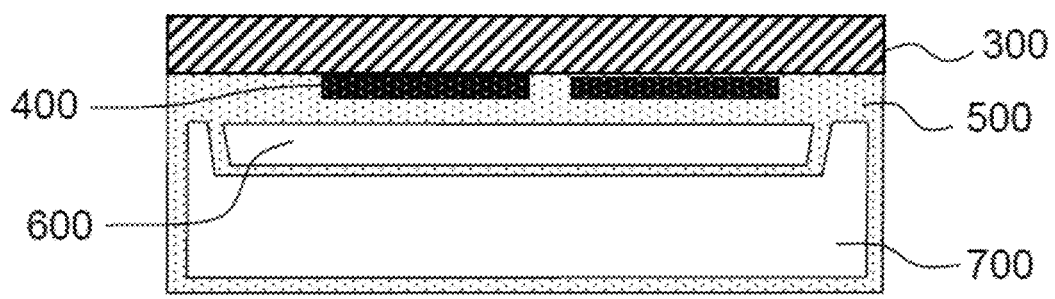
FIG. 4i illustrates the ninth step of an example of a process for producing a converter comprising two Lamb wave resonators according to the invention.

Step 4.9:
The temporary growth substrate 100 is then removed, by mechanical thinning finalized with chemical etching, as illustrated in FIG. 4i.

Figure 4J:
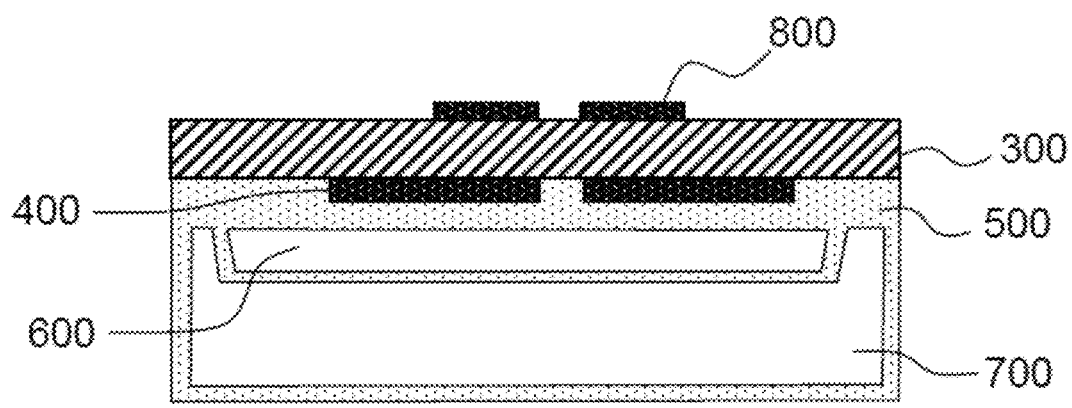
FIG. 4j illustrates the tenth step of an example of a process for producing a converter comprising two Lamb wave resonators according to the invention.

Step 4.10:
The metal from which the upper electrodes are made, for example 100 nm of ruthenium, is then deposited. Photolithography operations and ion etching, then resist removal are carried out in order to structure the electrodes 800 as illustrated in FIG. 4j.

Figure 4K:
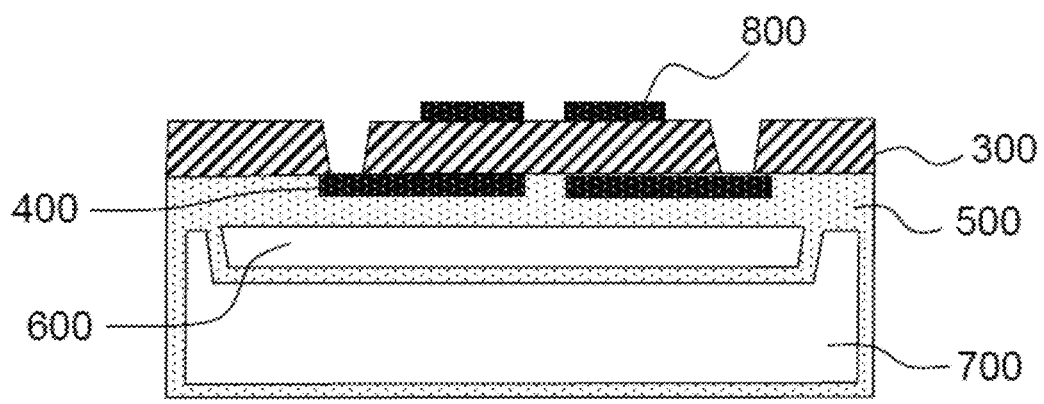
FIG. 4k illustrates the eleventh step of an example of a process for producing a converter comprising two Lamb wave resonators according to the invention.

Step 4.11:
A new photolithography operation, then ion etching of the PZT layer 300 are carried out in order to open holes for contacts to the lower electrodes 400, as illustrated in FIG. 4k.

Figure 4L:
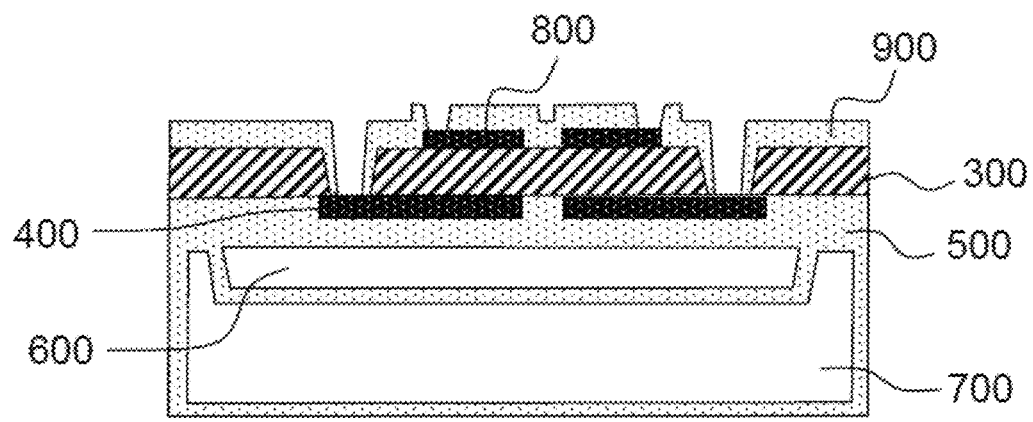
FIG. 4l illustrates the twelfth step of an example of a process for producing a converter comprising two Lamb wave resonators according to the invention.

Step 4.12:
Oxide 900 is deposited by PECVD, for example with a thickness of 200 nm, then photolithography operations are carried out to open holes for electrical contacts to the lower electrodes 400 and upper electrodes 800, as illustrated in FIG. 4l.

Figure 4M:
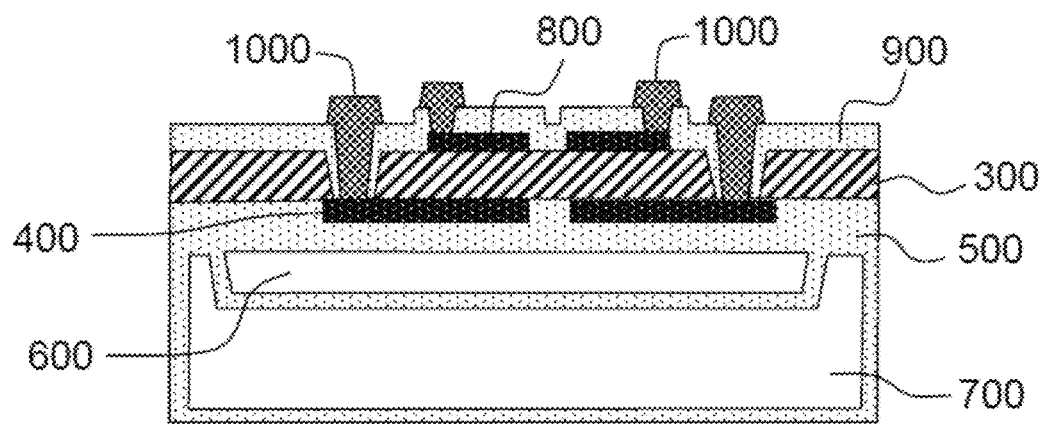
FIG. 4m illustrates the thirteenth step of an example of a process for producing a converter comprising two Lamb wave resonators according to the invention.

Step 4.13:
Cr/Au (1 µm) is deposited by sputtering, photolithography and wet etching, in order to form electrical contact pads 1000, as illustrated in FIG. 4m.

Figure 4N:
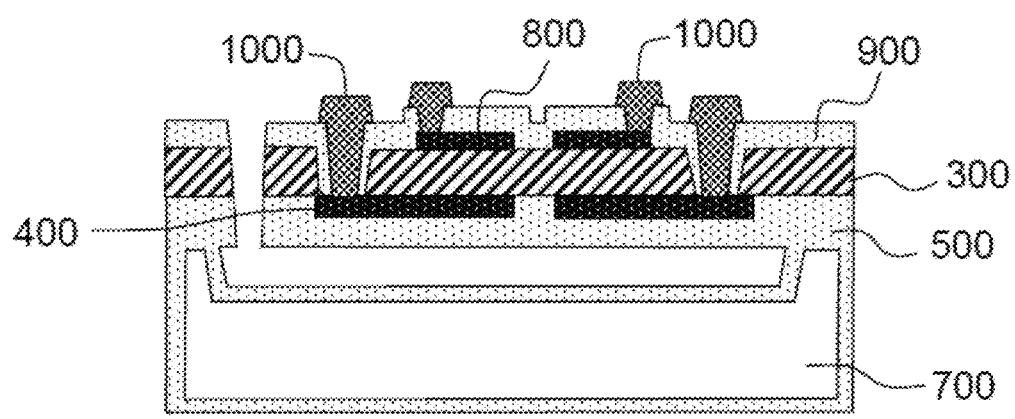
FIG. 4n illustrates the fourteenth step of an example of a process for producing a converter comprising two Lamb wave resonators according to the invention.

Step 4.14:
Photolithography operations and ionic etching are then carried out once more, but this time of the $SiO_2$/PZT/$SiO_2$ assembly, i.e. of 500/300/900, in order to open access to the sacrificial polysilicon structure 600. The polysilicon is then removed by etching with $XeF_2$ gas, as illustrated in FIG. 4n.

Step 4.15:
The ferroelectric material is polarized by applying a voltage.

This process also allows integration of PZT layers into substrates incompatible with the deposition temperatures required to obtain a crystallized PZT film to be envisioned. The invention therefore for example allows PZT actuators to be produced on glass.

Lastly, the present invention is not necessarily limited to resonator applications. It may be applied to other microsystems such as actuators or sensors.

The invention claimed is:

1. A process for fabricating a micro-electro-mechanical system, comprising the following steps:
   production of a stack on the surface of a temporary substrate so as to produce a first assembly, comprising:
   at least depositing a piezoelectric material or a ferroelectric material to produce a layer of piezoelectric material or of ferroelectric material;
   producing a first bonding layer;
   production of a second assembly comprising at least producing a second bonding layer on the surface of a host substrate;
   production of at least one acoustic isolation structure in at least one of the two assemblies;
   production of at least one electrode level containing one or more electrodes in at least one of the two assemblies;
   bonding said two assemblies via said two bonding layers such that said acoustic isolation structure is between said host substrate and layer of piezoelectric material or of ferroelectric material, before or after the production of the at least one electrode level in at least one of the two assemblies;
   removing said temporary substrate, wherein the process comprises:
   producing a sacrificial layer above a dielectric material;
   structuring said sacrificial layer so as to define a sacrificial layer structure;
   depositing a dielectric above said sacrificial layer structure;
   removing said sacrificial layer structure so as to define said acoustic isolation structure.

2. The process according to claim 1, wherein said piezoelectric material or said ferroelectric material is deposited by epitaxial growth.

3. The process according to claim 1, wherein the micro-electro-mechanical system comprises at least one bulk acoustic wave resonator or at least one surface acoustic wave resonator or at least one Lamb wave resonator.

4. The process according to claim 1, wherein the bonding comprises a step of thermal annealing.

5. The process according to claim 1, wherein the operation of removing the temporary substrate comprises:
   a step of thinning said temporary substrate;
   an operation of chemically etching said thinned temporary substrate.

6. The process according to claim 1, wherein the operation of removing said temporary substrate comprises:
   a step of diffusing elements that cause precipitation or chemical reactions in the material from which said temporary substrate is made, or
   a step of implanting ions into said temporary substrate.

7. The process according to claim 1, comprising depositing a buffer layer on the surface of said temporary substrate, prior to the deposition of said piezoelectric material or of said ferroelectric material.

8. A micro-electro-mechanical system obtained using the process according to claim 1.

9. The process according to claim 1, wherein the dielectric material is an oxide that may be $SiO_2$, the sacrificial layer being made of amorphous silicon or of polysilicon.

10. The process according to claim 1, wherein the production of the acoustic isolation structure comprises:
    producing at least one sacrificial layer in said first assembly;
    releasing said sacrificial layer structure after bonding said two assemblies.

11. A process for fabricating a micro-electro-mechanical system, comprising the following steps:
    production of a stack on the surface of a temporary substrate so as to produce a first assembly, comprising:
    at least depositing a piezoelectric material or a ferroelectric material to produce a layer of piezoelectric material or of ferroelectric material;
    producing at least one so-called lower electrode on the surface of said layer of piezoelectric material or of ferroelectric material;
    producing an acoustic isolation structure in said first assembly, wherein the production of the acoustic isolation structure comprises producing a Bragg mirror structure (MR); and
    producing a first bonding layer;
    production of a second assembly comprising at least producing a second bonding layer on the surface of a host substrate;

bonding said two assemblies via said two bonding layers, after the production of the at least one lower electrode and the acoustic isolation structure;

removing said temporary substrate, and after removing said temporary substrate, producing at least one so-called upper electrode on said layer of piezoelectric material or of ferroelectric material by depositing and structuring said upper electrode.

12. The process according to claim 11, comprising the production of structured layers made of metal and of molybdenum, said structured layers being inserted into the dielectric that are $SiO_2$.

13. The process according to claim 1, comprising:

prior to said bonding of the two assemblies, producing at least one so-called lower electrode on the surface of said layer of piezoelectric material or of ferroelectric material and producing an acoustic isolation structure in said first assembly;

after removing said temporary substrate, producing at least one so-called upper electrode on said layer of piezoelectric material or of ferroelectric material.

14. The process according to claim 1, comprising, prior to said bonding of said two assemblies:

producing electrodes on the surface of said layer of piezoelectric material or of ferroelectric material;

producing an acoustic isolation structure in said second assembly.

15. The process according to claim 1, wherein the piezoelectric material is $LiNbO_3$ or $LiTaO_3$ or solid solutions thereof, or $KNbO_3$ or AlN or GaN.

16. The process according to claim 1, wherein the ferroelectric material is: $LiNbO_3$ or $LiTaO_3$ or PZT.

17. The process according to claim 1, wherein the temporary substrate is made of MgO or of $SrTiO_3$ or of $LaAlO_3$ or of LSAT (($LaAlO_3)_{0.3}(Sr_2TaAlO_6)_{0.7}$) or of $DyScO_3$, or of sapphire ($Al_2O_3$) or of lithium niobate ($LiNbO_3$) or of lithium tantalate ($LiTaO_3$) or of quartz, the piezoelectric material being PZT.

18. The process according to claim 1, wherein the bonding layers are made of oxide or made of polymer.

* * * * *